United States Patent
Lee et al.

(10) Patent No.: US 8,415,861 B2
(45) Date of Patent: Apr. 9, 2013

(54) WAVE POWER GENERATOR

(75) Inventors: Hsien-Hua Lee, Kaohsiung (TW); Teng-Chieh Tsou, Kaohsiung (TW)

(73) Assignee: National Sun Yat-Sen University, Kaohsiung (TW)

(*) Notice: Subject to any disclaimer, the term of this patent is extended or adjusted under 35 U.S.C. 154(b) by 420 days.

(21) Appl. No.: 12/907,134

(22) Filed: Oct. 19, 2010

(65) Prior Publication Data

US 2011/0260582 A1 Oct. 27, 2011

(30) Foreign Application Priority Data

Apr. 27, 2010 (TW) ................................ 99113335 A

(51) Int. Cl.
*H01L 41/09* (2006.01)
(52) U.S. Cl. ....................................................... 310/339
(58) Field of Classification Search ................... 310/339
See application file for complete search history.

(56) References Cited

U.S. PATENT DOCUMENTS

| | | | | |
|---|---|---|---|---|
| 4,404,490 A * | 9/1983 | Taylor et al. | .................. | 310/339 |
| 5,814,921 A * | 9/1998 | Carroll | .......................... | 310/339 |
| 7,679,271 B2 * | 3/2010 | Genis et al. | .................... | 310/339 |
| 7,732,994 B2 * | 6/2010 | Clingman et al. | ............ | 310/339 |
| 2010/0052324 A1 * | 3/2010 | Priya | .............................. | 290/50 |

* cited by examiner

*Primary Examiner* — Thomas Dougherty
(74) *Attorney, Agent, or Firm* — Jackson IPG PLLC

(57) ABSTRACT

A wave power generator comprises a transmitting module and a piezoelectric generator, the transmitting module comprises a raft, a transmission member and a coupling member, the raft has a surface, and the transmission member is disposed at the first surface. The piezoelectric generator has a case and at least one piezoelectric module. The transmitting member has a vibrating portion. The coupling member comprises a rotating wheel and a crank rod, the rotating wheel is driven by the vibrating portion, and the crank rod is driven by the rotating wheel. The case comprises a second surface and at least one accommodating slot recessed into the second surface. The piezoelectric module is disposed into the accommodating slot and comprises at least one frame body, a moving member and a plurality of piezoelectric portions. The moving member is penetrated into the frame body and moved back and forth in the frame body.

6 Claims, 6 Drawing Sheets

WAVE POWER GENERATOR

FIELD OF THE INVENTION

The present invention is generally relating to a wave power generator, more particularly to a wave power generator that can generate power by reciprocating waves.

BACKGROUND OF THE INVENTION

Referring to FIG. 1, a conventional wave power generator 300 comprises a vibrator 310 having at least one swing member 311, a plurality of piezoelectric portions 320, a plurality of electrodes 330 and a plurality of fan blades 340. The swing member 311 comprises a first side 312, a second side 313 corresponded to the first side 312, a first combining member 314 and a second combining member 315. The piezoelectric portions 320 are formed at the first side 312 and the second side 313 of the vibrator 310 separately. Each of the electrodes 330 is connected with each of the piezoelectric portions 320. The fan blades 340 are fixed at the first combining member 314 and the second combining member 315 separately and the swing member 311 of the vibrator 310 can be driven by the fan blades 340 to enable the piezoelectric portions 320 to be deformed to generate voltages. However, the conventional wave power generator 300 is not suitable for wave energy, besides, the quantity of the piezoelectric portions 320 can not be effectively increased so that the output power of the wave power generator 300 is limited.

SUMMARY

A primary object of the present invention is to provide a wave power generator comprising a transmission module and a piezoelectric generator. The transmission module comprises a raft, a transmission member and a coupling member, the raft has a first surface, and the transmission member is disposed at the first surface. The piezoelectric generator has a case and at least one piezoelectric module. The transmission member has a vibrating portion. The coupling member comprises a rotating wheel and a crank rod, the rotating wheel is driven by the vibrating portion, and the crank rod is driven to rotate by the rotating wheel. The case comprises a second surface and at least one accommodating slot recessed into the second surface. The piezoelectric module is disposed into the accommodating slot and comprises at least one frame body, a moving member and a plurality of piezoelectric portions. The moving member is penetrated into the frame body. Each of the piezoelectric portions comprises a first end and a second end, each of the first ends is fixed at the frame body, each of the second ends is fixed at the moving member, the moving member is capable of moving back and forth in the frame body, and one end of the moving member is pivotally disposed at the crank rod. The rotating wheel is driven by the vibrating portion to enable the crank rod to rotate, and the moving member is driven by the crank rod thereby enabling the moving member to move back and forth in the frame body. In this invention, via mentioned design, the wave power generator is particularly suitable for wave energy. Besides, the moving member of the piezoelectric module can be actuated simultaneously by the crank rod, and the piezoelectric portions can be driven by the moving member. Therefore, the output power of the wave power generator can be significantly increased.

DETAILED DESCRIPTION OF THE INVENTION

Figure 1:
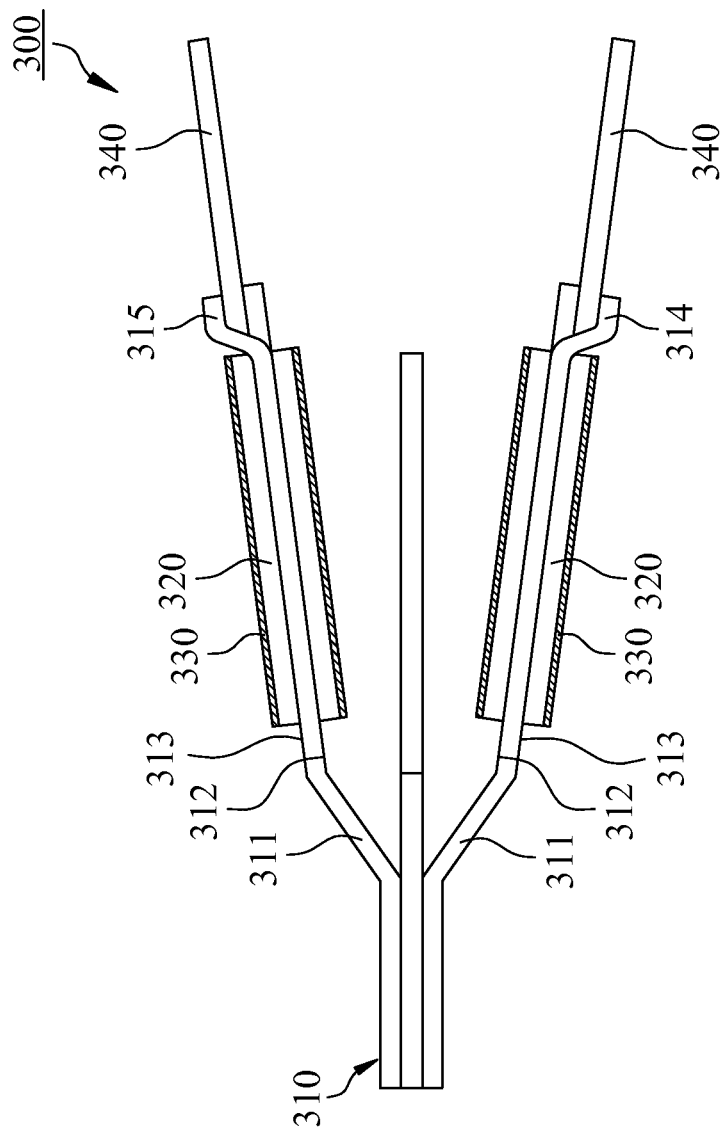
FIG. 1 is a perspective assembly view illustrating conventional wave power generator.
Figure 2:
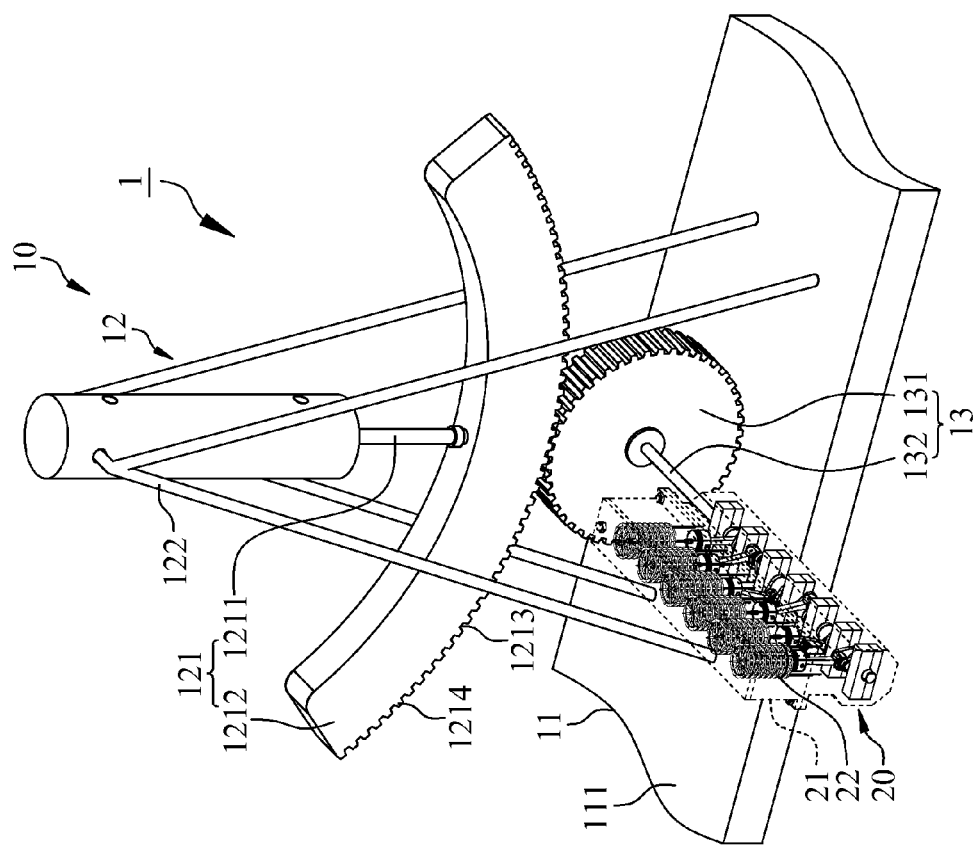
FIG. 2 is a perspective assembly view illustrating a wave power generator in accordance with an embodiment of the present invention.
Figure 3:
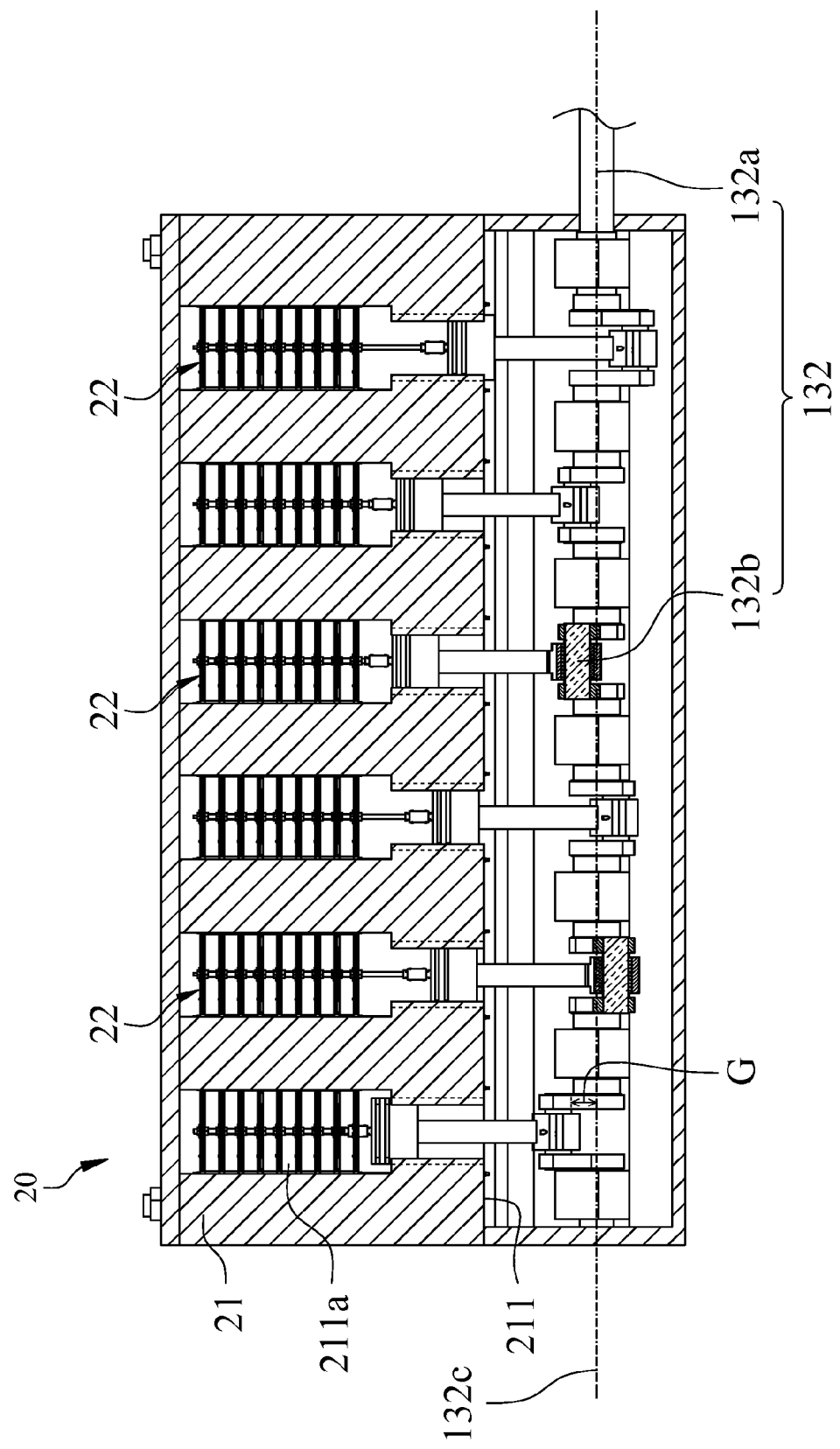
FIG. 3 is a lateral section view illustrating a piezoelectric generator in accordance with an embodiment of the present invention.
Figure 4:
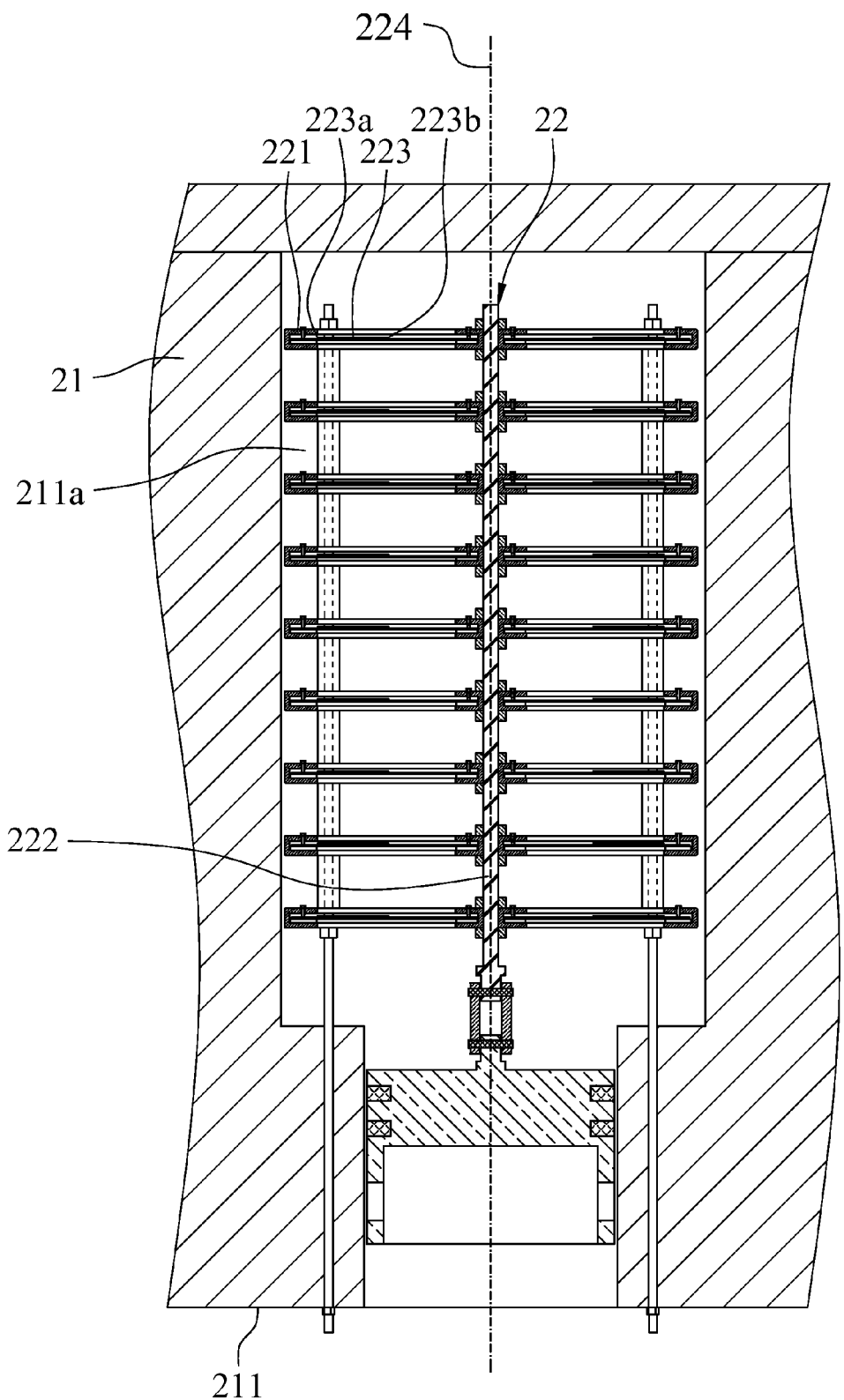
FIG. 4 is a lateral section view illustrating a piezoelectric module of the piezoelectric generator in accordance with an embodiment of the present invention.
Figure 5:
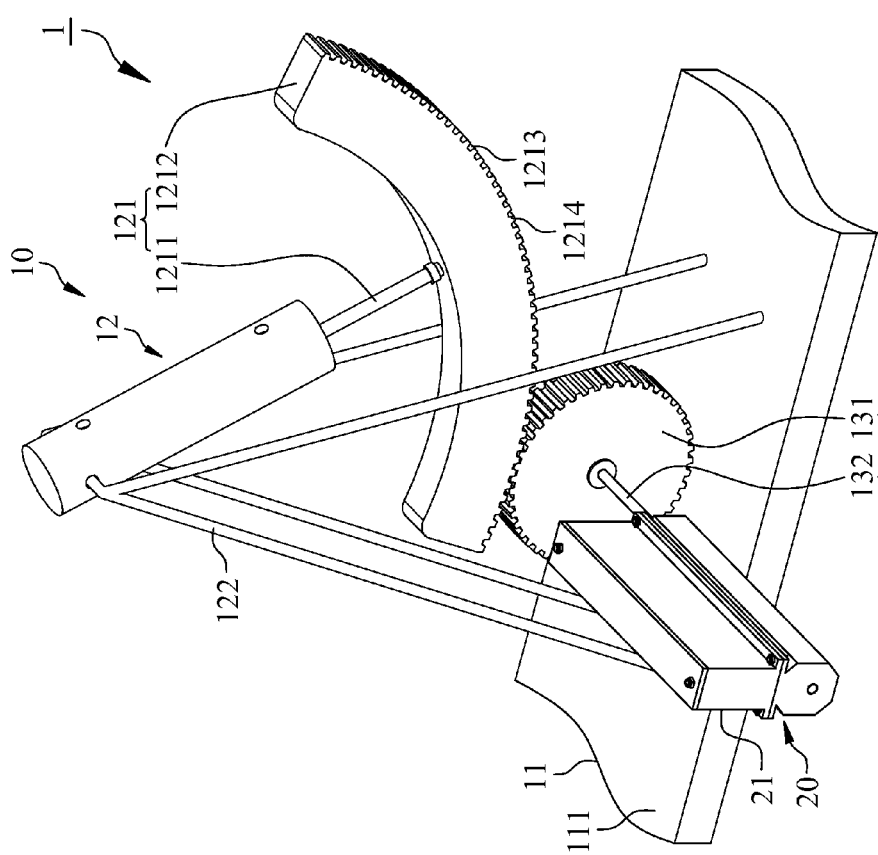
FIG. 5 is a first action diagram illustrating the wave power generator in accordance with an embodiment of the present invention.
Figure 6:
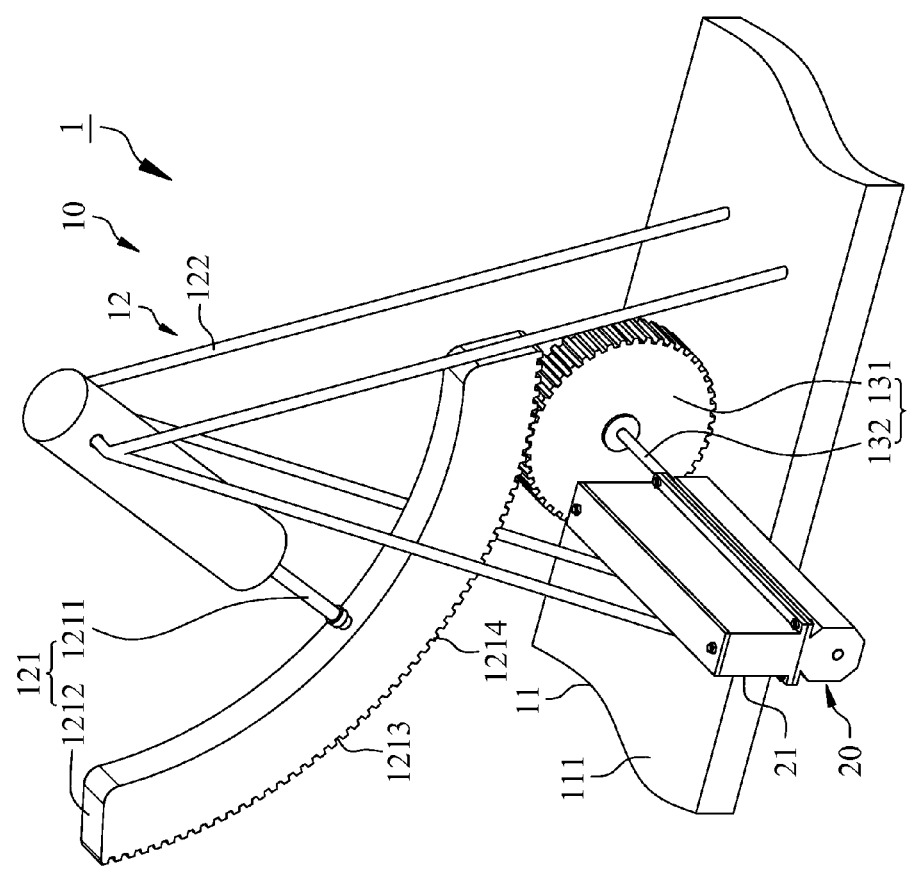
FIG. 6 is a second action diagram illustrating the wave power generator in accordance with an embodiment of the present invention.

Referring to FIGS. 2, 3 and 4, a wave power generator 1 in accordance with an embodiment of the present invention comprises a transmission module 10 and a piezoelectric generator 20, wherein the transmission module 10 comprises a raft 11, a transmission member 12 and a coupling member 13, the raft 11 has a first surface 111, and the transmission member 12 is disposed at the first surface 111 of the raft 11. The piezoelectric generator 20 has a case 21 and a plurality of piezoelectric modules 22. The transmission member 12 comprises a vibrating portion 121, the coupling member 13 has a rotating wheel 131 and a crank rod 132, the rotating wheel 131 is driven by the vibrating portion 121, and the crank rod 132 is driven by the rotating wheel 131. In this embodiment, the rotating wheel 131 can be a gear. The case 21 comprises a second surface 211 and a plurality of accommodating slots 211a recessed into the second surface 211. Each of the piezoelectric modules 22 is disposed at each of the accommodating slots 211a and comprises a plurality of frame bodies 221, a moving member 222 and a plurality of piezoelectric portions 223. The moving member 222 of each of the piezoelectric modules 22 is penetrated into the frame bodies 221. Each of the piezoelectric portions 223 has a first end 223a and a second end 223b, each of the first ends 223a is fixed at the frame body 221, each of the second ends 223b is fixed at the moving member 222, the moving member 222 of each of the piezoelectric modules 22 is moved back and forth in the frame bodies 221, and one end of the moving member 222 of each of the piezoelectric modules 22 is pivotally disposed at the crank rod 132.

Referring to FIG. 2, the transmission member 12 further comprises a holder 122, and the vibrating portion 121 is pivotally disposed at the holder 122. In this embodiment, the vibrating portion 121 further comprises a first rod 1211 pivotally disposed at the holder 122 and an arc plate 1212 having a bottom surface 1213. A toothed rack 1214 is formed on the bottom surface 1213, and the toothed rack 1214 is engaged with the rotating wheel 131. With reference to FIGS. 3 and 4, the crank rod 132 comprises a second rod 132a and a plurality of cranks 132b protruded to the second rod 132a. In this embodiment, one end of the moving member 222 is pivotally disposed at the crank 132b. The second rod 132a has a center line 132c, a gap G is formed between each of the cranks 132b and the center line 132c, and the length of each of the gaps G is the same. When the moving member 222 of each of the piezoelectric modules 22 is moved back and forth in the frame bodies 221, each of the moving members 222 possesses the same displacement via the same length between each of the cranks 132b and the center line 132c.

Referring to FIGS. 3, 4, 5 and 6, when the wave power generator 1 is impacted by waves, the vibrating portion 121 is capable of moving back and forth to show reciprocating action. The coupling member 13 can be driven by swings of the vibrating portion 121, and the moving member 222 of each of the piezoelectric modules 22 is driven by the crank 132b of the coupling member 13 thereby enabling the moving member 222 of each of the piezoelectric modules 22 to move back and forth in the frame bodies 221. In this embodiment, the frame bodies 221 further comprise an axis line 224, preferably, the axis line 224 is the center line of the frame bodies 221, and the moving member 222 of each of the piezoelectric modules 22 is moved back and forth along with the center line of the frame bodies 221. Therefore, the wave power generator 1 is particularly suitable for wave energy. The moving member 222 of each of the piezoelectric modules 22 can be actuated simultaneously by the crank 132b of the coupling member 13, and the piezoelectric portions 223 are driven by the moving member 222 of each of the piezoelectric modules 22. Therefore, the output power of the wave power generator 1 can be significantly increased.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A wave power generator comprising:
   a transmission module comprising:
      a raft having a first surface;
      a transmission member disposed at the first surface of the raft, the transmission member comprises a vibrating portion; and
      a coupling member having a rotating wheel and a crank rod, the rotating wheel is driven by the vibrating portion, and the crank rod is driven by the rotating wheel; and
   a piezoelectric generator having a case and at least one piezoelectric module, the case comprises a second surface and at least one accommodating slot recessed into the second surface, the piezoelectric module is disposed at the accommodating slot and comprises at least one frame body, a moving member penetrated into the frame body and a plurality of piezoelectric portions, each of the piezoelectric portions has a first end and a second end, each of the first ends is fixed at the frame body, each of the second ends is fixed at the moving member, the moving member is moved back and forth in the frame body, and one end of the moving member is pivotally disposed at the crank rod.

2. The wave power generator in accordance with claim 1, wherein the transmission member further comprises a holder, and the vibrating portion is pivotally disposed at the holder.

3. The wave power generator in accordance with claim 2, wherein the vibrating portion comprises a first rod pivotally disposed at the holder and an arc plate.

4. The wave power generator in accordance with claim 1, wherein the rotating wheel can be a gear.

5. The wave power generator in accordance with claim 3, wherein the arc plate comprises a bottom surface, a toothed rack is formed on the bottom surface, and the toothed rack is engaged with the rotating wheel.

6. The wave power generator in accordance with claim 1, wherein the crank rod comprises a second rod and a plurality of cranks protruded to the second rod, and one end of the moving member is pivotally disposed at the crank.

* * * * *